US008077539B2

(12) United States Patent
Smith et al.

(10) Patent No.: US 8,077,539 B2
(45) Date of Patent: Dec. 13, 2011

(54) ACOUSTIC REFLECTOR

(75) Inventors: John Darren Smith, Salisbury (GB); David Emery, Dorchester (GB); Duncan Paul Williams, Dorchester (GB)

(73) Assignee: The Secretary of State for Defence (GB)

( * ) Notice: Subject to any disclaimer, the term of this patent is extended or adjusted under 35 U.S.C. 154(b) by 1185 days.

(21) Appl. No.: 11/795,211

(22) PCT Filed: Jan. 13, 2006

(86) PCT No.: PCT/GB2006/000116
§ 371 (c)(1),
(2), (4) Date: Jul. 13, 2007

(87) PCT Pub. No.: WO2006/075167
PCT Pub. Date: Jul. 20, 2006

(65) Prior Publication Data

US 2008/0111448 A1 May 15, 2008

(30) Foreign Application Priority Data

Jan. 14, 2005 (GB) .................................. 0500646.5

(51) Int. Cl.
*H01L 41/00* (2006.01)

(52) U.S. Cl. .......................................................... 367/2

(58) Field of Classification Search .............. 367/2, 131; 181/175, 212
See application file for complete search history.

(56) References Cited

U.S. PATENT DOCUMENTS

| | | | | |
|---|---|---|---|---|
| 2,943,296 A | | 6/1960 | Fryklund | |
| 3,014,198 A | * | 12/1961 | Harris | 367/151 |
| 3,409,868 A | | 11/1968 | Salathiel | |
| 3,599,747 A | | 8/1971 | Hansen et al. | |
| 3,723,962 A | | 3/1973 | Hotchner | |
| 4,126,847 A | | 11/1978 | Etkins | |
| 4,130,018 A | * | 12/1978 | Adams et al. | 73/290 V |

(Continued)

FOREIGN PATENT DOCUMENTS

DE 2855207 8/1979

(Continued)

OTHER PUBLICATIONS

G. Kaduchak, et al., "Relationship Between Material Parameters and Target Strength of Fluid-Filled Spherical Shells in Water: Calculations and Observations," IEEE J. Oceanic Eng., vol. 23, No. 1, Jan. 1998 (five pages).

(Continued)

*Primary Examiner* — Daniel Pihulic
(74) *Attorney, Agent, or Firm* — Dean W. Russell; Kilpatrick Townsend & Stockton LLP

(57) ABSTRACT

An acoustic reflector (10) suitable for use as a reflective target for navigational aids and for location and re-location applications. The acoustic reflector comprises a shell (12) arranged to surround a solid core (16). The shell is adapted to transmit acoustic waves (18) incident thereon into the core (16). Within the core the acoustic waves are focused before being reflected from an opposing side of the shell (20) to provide a reflected acoustic wave. A portion of the acoustic waves incident on the shell is coupled into the shell wall and guided within and around the circumference thereof (26) before being re-radiated and combining constructively with the reflected acoustic wave to provide an enhanced reflected acoustic wave.

13 Claims, 1 Drawing Sheet

U.S. PATENT DOCUMENTS

Figure 1:
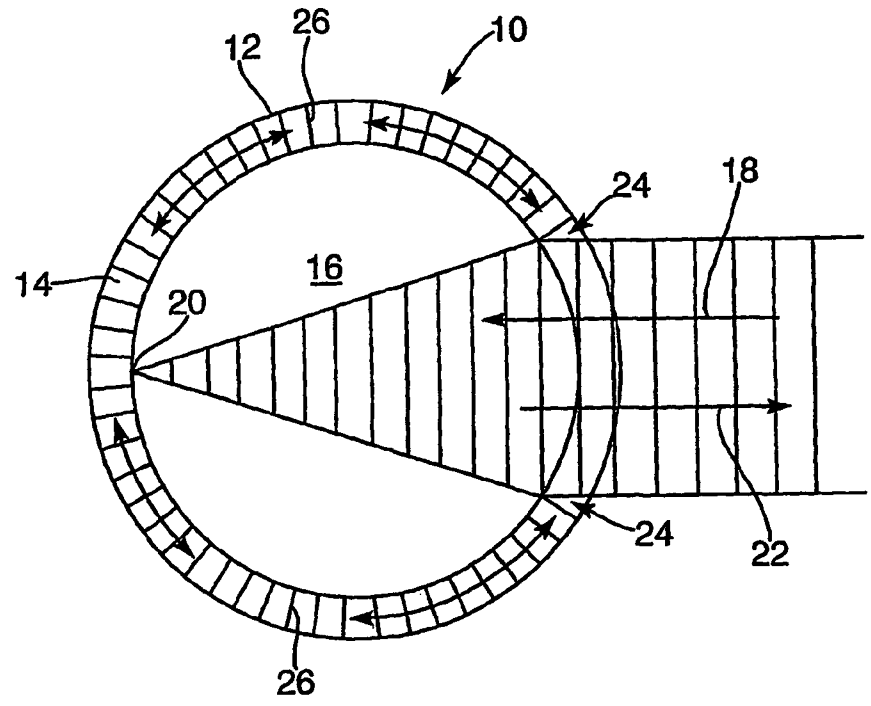

| | | | | |
|---|---|---|---|---|
| 4,836,328 | A | 6/1989 | Ferralli | |
| 5,365,024 | A | 11/1994 | Hasegawa et al. | |
| 5,615,176 | A | 3/1997 | LaCarrubba | |
| 5,822,272 | A | 10/1998 | Ream, Jr. | |
| 2008/0111448 | A1 * | 5/2008 | Smith et al. | 310/311 |
| 2009/0288910 | A1 | 11/2009 | Krebs et al. | |
| 2011/0100745 | A1 * | 5/2011 | Emery et al. | 181/175 |

FOREIGN PATENT DOCUMENTS

| | | | | |
|---|---|---|---|---|
| GB | 1465932 | | | 3/1977 |
| GB | 2422282 | A | * | 7/2006 |
| GB | 2437016 | A | * | 10/2007 |
| GB | 2458810 | A | * | 10/2009 |
| WO | WO2006075167 | | | 7/2006 |
| WO | WO 2009122184 | A2 | * | 10/2009 |

OTHER PUBLICATIONS

B. Hefner, et al., "Backscattering enhancements associated with subsonic Rayleigh waves on polymer spheres in water: Observation and modeling for acrylic spheres," J. Acoust. Soc. Am., vol. 107, No. 4, Apr. 2000, pp. 1930-1936.

International Search Report dated Oct. 2, 2009 in Application No. PCT/GB2009/000885.

International Preliminary Report on Patentability dated Oct. 14, 2010 in Application No. PCT/GB2009/000885.

GB Search Report dated Jul. 9, 2008 in Application No. GB 0805938.8.

GB Search Report dated Jul. 30, 2009 in Application No. GB 0905722.5.

* cited by examiner

ACOUSTIC REFLECTOR

CROSS REFERENCE TO RELATED APPLICATIONS

This application is the U.S. national phase of International Application No. PCT/GB2006/000116 filed on Jan. 13, 2006 published in English on Jul. 20, 2006 as International Publication No. WO 2006/075167 A1, which application claims priority to Great Britain Application No. 0500646.5 filed on Jan. 14, 2005, the contents of which are incorporated by reference herein.

The present invention relates to acoustic reflectors and particularly to underwater reflective targets used as navigational aids and for location and re-location.

Underwater reflective targets are typically acoustic reflectors which are generally used in sonar systems such as, for example, for tagging underwater structures. Relocation devices are used, for example, to identify pipelines, cables and mines and also in the fishing industry to acoustically mark nets.

In order to be effective an acoustic reflector needs to be easily distinguishable from background features and surrounding clutter and it is therefore desirable for such reflective targets to (a) be capable of producing a strong reflected acoustic output response (i.e. high target strength) relative to the strength of the acoustic waves reflected off background features and surrounding clutter and (b) have acoustic characteristics that enable it to be discriminated from other (false) targets.

Enhanced reflection of acoustic waves from a target is curtly achieved by refracting input acoustic waves, incident on a side of a spherical shell such that they are focused along an input path onto an opposing side from which they are reflected and emitted as an output reflected response. Alternatively, the input acoustic waves may be reflected more than once from an opposing side before being emitted as an output reflected wave.

Known underwater reflective targets comprise a fluid-filled spherical shell. Such fluid-filled spherical shell targets have high target strengths when the selected fluid has a sound speed of about 840 $ms^{-1}$. This is curtly achieved by using chlorofluorocarbons (CFCs) as the fluid inside the shell. Such liquids are generally undesirable organic-solvents, which are toxic and ozone-depleting chemicals. Fluid filled spherical shell reflective targets are therefore disadvantaged because use of such materials is restricted due to their potential to harm the environment as a result of the risk of the fluid leaking into, and polluting, the surrounding environment. Furthermore, fluid filled shell reflective targets are relatively difficult and expensive to manufacture.

Another known acoustic reflector is a triplane reflector which typically comprises three orthogonal reflective planes which intersect at a common origin. However, such reflectors may require a coating to make them acoustically reflective at frequencies of interest and for use in marine environments and, although capable of a high target strength, the reflective properties of the coating material are prone to variation with pressure due to depth under water. Furthermore, triplane reflectors are disadvantaged in that their reflectivity is dependent on, and restricted to, their aspect, wherein variations of greater than 6 dB of target strength can occur at different angles.

It is also desirable for there to be acoustic reflector tags suitable for attaching to, locating, tracking and monitoring marine mammals such as, for example, seals, dolphins and whales, for research purposes. It is desirable for such tags to be lightweight and small in size so as not to inhibit the animal in any way. However, the abovementioned known reflectors are not suitable for such applications. As mentioned above, the liquid filled sphere reflectors rely on toxic materials and are therefore considered to be potentially harmful to an animal to which it is attached and the surrounding environment in which the animal lives. The triplane reflector is not omni-directional but is, instead, dependent on, and restricted to, its aspect which is undesirable.

It is therefore desirable for there to be an acoustic reflector which is durable, non-toxic, small in size and relatively easy and inexpensive to manufacture.

According to the present invention there is provided an acoustic reflector comprising a shell having a wall arranged to surround a core, said shell being capable of transmitting acoustic waves incident on the shell into the core to be focused and reflected from an area of the shell located opposite to the area of incidence so as to provide a reflected acoustic signal output from the reflector, characterised in that the core is in the form of a sphere or right cylinder and is formed of one or more concentric layers of a solid material having a wave speed of from 840 to 1500 $ms^{-1}$ and that the shell is dimensioned relative to the core such that a portion of the acoustic waves incident on the shell are coupled into the shell wall and guided therein around the circumference of the shell and then re-radiated to combine constructively with the said reflected acoustic signal output so as to provide an enhanced reflected acoustic signal output.

The reflector may be in the shape of either a sphere or a cylinder with the circular cross section orthogonal to the generator. In the latter case the reflector would be in the form of a long continuous system, ie a rope, with high sonar returns coming from specular glints from those parts of the rope which are disposed at right angles to the direction of travel of the acoustic signal.

Preferably, the core is formed from a single solid material having a wave speed between 840 $ms^{-1}$ and 1300 $ms^{-1}$. Alternatively, the core may comprise two or more layers of different materials where, for a particular selected frequency of the acoustic waves, these would provide either more effective focussing of the incoming waves and/or lower attenuation within the material so as to result, overall, in a stronger output signal. Naturally, however, the complexity and costs of manufacture in the case of a layered core would be expected to be greater. Where the core is formed of two or more layers of different materials, either or both of the materials may have a wave speed of up to 1500 $ms^{-1}$.

To be suitable for use in the reflector device of the invention, the core material must be such that it exhibits a wave speed in the required range without suffering from a high absorption of acoustic energy. The core may be formed from an elastomer material such as, for example, a silicone, particularly RTV12 or RTV655 silicone rubbers from Bayer or Alsil 14401 peroxide-cured silicone rubber.

The shell may be formed of a rigid material, such as, for example, a glass reinforced plastics (GRP) material, particularly a glass filled nylon such as 50% glass filled Nylon 66 or 40% glass filled semi-aromatic polyamide, or steel and may be dimensioned such that its thickness is approximately one-tenth of the radius of the core. However, the derivation of the appropriate relationship between these parameters in relation to the characteristics of the materials used for the core and shell will be readily understand by the skilled person.

The concept of combining waves transmitted through the shell of the reflector with internally focused waves can be exploited within the design of the device to provide a highly recognisable feature or features in the enhanced reflected acoustic signal output from the device. For example, the signal output might be arranged to possess a characteristic time signature or spectral content.

By appropriately adapting the sonar which is being used to detect the acoustic signal output so as to recognise the characteristic feature in the output, it then becomes possible to more readily distinguish between the signal from the reflector of the invention and background clutter and returns from other (false) targets lying in the field of view of the sonar detector being employed.

Figure 2:
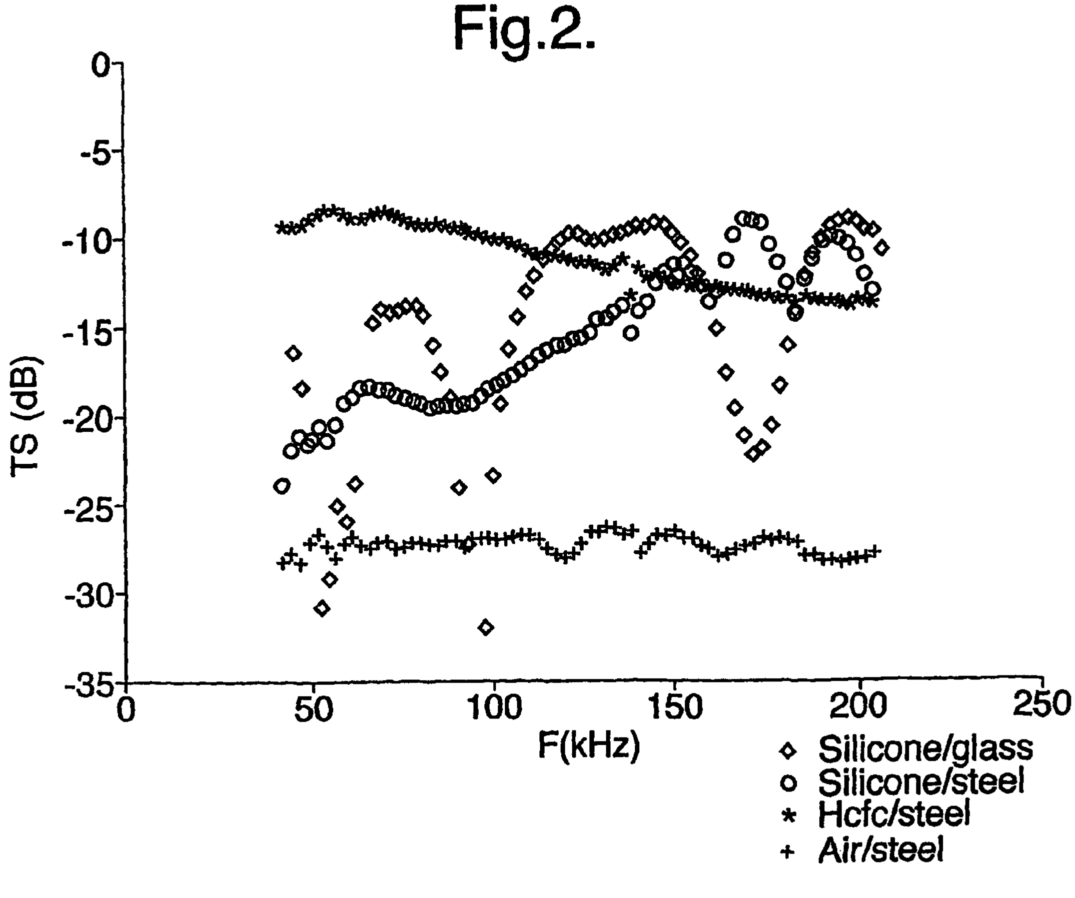

The present invention will now be described, by way of example, with reference to the accompanying drawings, in which:

FIG. 1 is a schematic representation of a cross section through an acoustic reflector according to the present invention; and, FIG. 2 is a graph showing Frequency against Target Strength for different combinations of shell and core materials of acoustic reflectors.

Referring to FIG. 1, an acoustic reflector 10 comprises a spherical shell 12 having a wall 14. The wall 14 surrounds a core 16.

The shell 12 is formed from a rigid material such as a glass reinforced plastics (GRP) material or steel. The core 16 is formed from a solid material such as an elastomer. The frequency, or range of frequencies, at which the acoustic reflector is applicable is dependent on predetermined combinations of materials, used to form the shell and core, and the relative dimensions thereof.

However, as will be appreciated by the reader, other combinations of materials may be used provided the shell and core are dimensioned relative to each other in accordance with the wave propagating properties of the materials used.

Incident acoustic waves 18, transmitted from an acoustic source (not shown), are incident on the shell 12. Where the angle of incidence is high most of the acoustic waves 18 are transmitted, through the shell wall 14, into the core 16. As the acoustic waves 18 travel through the core 16 they are refracted and thereby focused onto an opposing side 20 of the shell, from which the acoustic waves 18 are reflected back, along the same path, as a reflected acoustic signal output 22. However, where the angle of incidence is smaller, at a coupling region 24 of the shell, i.e. at a sufficiently shallow angle relative to the shell, a portion of the incident waves 18 is coupled into the wall 14 to provide shell waves 26 which are guided within the wall 14 around the circumference of the shell 12.

The materials which form the shell 12 and the core 16 and the relative dimensions of the shell and core are predetermined such that the transit time of the shell wave 26 is the same as the transit time of the internal geometrically focused returning wave (i.e the reflected acoustic signal output 22). Therefore, the contributions of the shell wave, which is re-radiated into the fluid, and the reflected acoustic signal output are in phase with each other and therefore combine constructively at a frequency of interest to provide an enhanced reflected acoustic signal output (i.e. a high target strength). That is to say, for a spherical acoustic reflector the circumference of the shell is the path length and therefore must be dimensioned in accordance with the respective transmission speed properties of the shell and the core, such that resonant standing waves are formed in the shell which are in phase with the reflected acoustic signal output to combine constructively therewith.

FIG. 2 presents data obtained by numerical modelling, comprising the frequency (F) of the incident acoustic waves plotted against the target strength (S) for a spherical acoustic reflector according to the present invention, having a silicone core (100 mm radius)/GRP shell (11.7 mm thick shell), shown as diamonds plotted on the graph.

Data, similarly obtained, for a spherical acoustic reflector according to the present invention, having a silicone core (100 mm radius)/steel shell (1.7 mm thick shell), is shown as circles plotted on the same graph.

These results can be compared on the graph of FIG. 2, with data also obtained by numerical modeling for spherical acoustic reflectors having the known combination of a liquid chlorofluorocarbons (CFC) core/steel shell (1.3 mm thick shell) which is shown as asterisks plotted on the graph, and for a reference combination of an air core/steel shell which is shown as crosses plotted on the graph.

As can be seen on the graph the silicone core/GFRP shell acoustic reflector (diamond plots) has peaks of relatively high target strength at frequencies of between approximately 120 kHz and 150 kHz and between approximately 185 kHz and 200 kHz.

The silicone core/steel shell acoustic reflector (circle plots) has peaks of relatively high target strength at frequencies of between approximately 160 Hz 180 kHz and between approximately 185 kHz and 200 kHz.

It will also be noted that the target strength of the known liquid CFC core/steel shell acoustic reflector (asterisk plots) is significantly less at these frequencies of interest and tends to lessen as the frequency increases.

In addition to being advantageous in that it is formed of acceptable materials which are not considered to be harmful to the environment and that it is relatively easy and inexpensive to manufacture, the present invention further advantageously provides an acoustic reflector with comparable target strength up to 100 kHz and enhanced target strength at frequencies greater than 100 kHz with respect to known acoustic reflectors.

It will be appreciated by the reader that different combinations of solid core and rigid shell materials may be used provided they are dimensioned to provide shell waves which are in phase with the reflected acoustic signal output such that they combine constructively therewith.

The invention claimed is:

1. An acoustic reflector comprising a shell having a wall arranged to surround a core, said shell being capable of transmitting acoustic waves incident on the shell into the core to be focused and reflected from an area of the shell located opposite to the area of incidence of the acoustic waves so as to provide a reflected acoustic signal output from the reflector, wherein the core is in the form of a sphere or right cylinder and is formed of one or more concentric layers of a solid material having a compressional wave speed of from 840 to 1500 $ms^{-1}$ and wherein the shell is dimensioned relative to the core such that a portion of the acoustic waves incident on the shell are coupled into the shell wall and guided therein around the circumference of the shell and then re-radiated to combine constructively with the said reflected acoustic signal output to provide an enhanced reflected acoustic signal output.

2. An acoustic reflector, as claimed in claim 1, wherein the core is formed from a single solid material having a compressional wave speed between 850 $ms^{-1}$ and 1300 $ms^{-1}$.

3. An acoustic reflector, as claimed in claim 1, wherein the core is formed from an elastomer material.

4. An acoustic reflector, as claimed in claim 3, wherein the elastomer material is a silicone.

5. An acoustic reflector, as claimed in claim 1, wherein the shell is formed from a rigid material.

6. An acoustic reflector, as claimed in claim 5, wherein the rigid material is a glass reinforced plastics (GRP) material.

7. An acoustic reflector, as claimed in claim 5, wherein the rigid material is steel.

8. An acoustic reflector as claimed in claim 6 wherein the rigid material is a glass filled nylon.

9. An acoustic reflector as claimed in claim 2 wherein the core comprises one or more further materials adapted to enhance focusing of the acoustic waves transmitted into the core.

10. An acoustic reflector as claimed in claim 1, wherein the enhanced reflected acoustic signal output is sufficiently characteristic to provide discrimination from other reflectors of the same acoustic waves.

11. An acoustic reflector as claimed in claim 9 wherein the signal output is characterised by a specific time signature.

12. An acoustic reflector as claimed in claim 9 wherein the signal output is characterised by its spectral content.

13. An acoustic reflector comprising a shell member defining an enclosure and a core member occupying said enclosure wherein said shell member is adapted to transmit acoustic waves incident on the shell member into the core to be focused and reflected from an area of the shell located opposite to the area of incidence of the acoustic waves so as to provide a reflected acoustic signal output from the reflector, wherein the core is in the form of a sphere or right cylinder and is formed of one or more concentric layers of a solid material having a compressional wave speed of from 840 to 1500 $ms^{-1}$ and wherein the shell member is dimensioned relative to the core such that a portion of the acoustic waves incident on the shell member are coupled into, and pass around the circumference of, the shell member and are re-radiated and combined constructively with the said reflected acoustic signal output to provide an enhanced reflected acoustic signal output.

* * * * *